United States Patent [19]

Stoffel et al.

[11] Patent Number: 4,712,018

[45] Date of Patent: Dec. 8, 1987

[54] METHOD AND APPARATUS FOR FABRICATING FULL WIDTH SCANNING ARRAYS

[75] Inventors: James C. Stoffel, Rochester; Jagdish C. Tandon, Fairport, both of N.Y.

[73] Assignee: Xerox Corporation, Stamford, Conn.

[21] Appl. No.: 30,308

[22] Filed: Mar. 26, 1987

Related U.S. Application Data

[62] Division of Ser. No. 462,593, Jan. 31, 1983, Pat. No. 4,690,391.

[51] Int. Cl.$^4$ ............................................. H01J 40/14
[52] U.S. Cl. .................................... 250/578; 250/239; 357/75
[58] Field of Search ................ 250/211 R, 211 J, 578, 250/239; 358/213.11, 293, 294; 357/30 D, 30 H, 74, 75; 346/76 PH, 76 Z; 313/500, 501

[56] References Cited

U.S. PATENT DOCUMENTS 4,457,017  6/1984  Onogi et al. ......................... 250/578
4,644,411  2/1987  Sato et al. ............................ 358/294

Primary Examiner—David C. Nelms
Attorney, Agent, or Firm—Frederick E. McMullen

[57] ABSTRACT

A method and apparatus for fabricating long full width scanning arrays for reading or writing images. For this purpose, smaller scanning arrays are assembled in abutting end-to-end relationship, each of the smaller arrays being provided with a pair of V-shaped locating grooves in the face thereof. An aligning tool having predisposed pin-like projections insertable into the locating grooves on the smaller scanning arrays upon assembly of the smaller arrays with the aligning tool is used to mate a series of the smaller arrays in end-to-end abutting relationship, there being discretely located vacuum ports in the aligning tool to draw the smaller arrays into tight face-to-face contact with the tool. A suitable base is then affixed to the aligned arrays and the aligning tool withdrawn.

3 Claims, 6 Drawing Figures

METHOD AND APPARATUS FOR FABRICATING FULL WIDTH SCANNING ARRAYS

This is a division of application Ser. No. 462,593, filed 1/31/83, now U.S. Pat. No. 4,690,391.

The invention relates to full width scanning arrays, and more particularly, to method and apparatus for fabricating full width scanning arrays from a plurality of smaller scanning arrays.

With the increased interest in raster scanners, both to read and write images, has come renewed demand in the art for an economical full width scanning array. For in the current stage of scanner technology, the art is without a commercially acceptable and economically feasible method of producing very long unitary scanning arrays, that is, single arrays of sufficient linear extent and with the requisite number of image processing elements to scan an entire line at once with a high image resolution. In this context, when speaking of scanning arrays, there are both image reading arrays which comprise a succession of image sensing elements to convert the image line to electrical signals or pixels, and image writing arrays which comprise a succession of light producing or other elements employed to produce images in response to an image signal or pixel input.

The prior art has faced this failure or inability to provide long full width scanning arrays with various proposals. These include optical and electrical arrangements for overlapping plural shorter arrays and abutting short arrays together end to end. However, none of these proposals has met with any great degree of success. For example, in the case of abutting smaller arrays together, due to the difficulty of exactly aligning and mating the array ends with one another, losses and distortion of the image often occur.

The invention seeks to solve the aforedescribed problems by providing a method of assemblying a number of relatively short scanning arrays in acurate end to end abutting relation to form a composite linear scanning array of predetermined length, the method comprising the steps of: providing at least one array aligning formations at preset locations and integral with one face of each of the short arrays; placing one of the short arrays in face to face contact with an aligning tool having plural mating array aligning formations at preset fixed locations thereon so that at least one of the tool aligning formations is aligned with the aligning formation of the short array; repeating the preceding step for each of the short arrays until a composite array of desired length is obtained; and bringing the short arrays and aligning tool tightly together to cause the aligning formations of the short arrays and the aligning formations of the aligning tool to inter-engage and thereby align the short arrays with one another in accurate end to end relationship to form the composite array of desired length.

The invention further relates to a tool for locating a preset number of smaller scanning arrays in exact end to end abutting relation to provide a longer composite scanning array of predetermined length, comprising: a base having at least one substantially flat surface; and a plurality of discrete array aligning formations on the flat surface of the tool base arranged in a predetermined array alignment pattern, the array aligning formations being adapted to mate with complementary array aligning formations on each of the small arrays on assembly of the smaller arrays with the tool base to thereby accurately locate and align the smaller arrays in abutting relation with one another to provide a longer composite scanning array.

The invention further relates to a scanning array designed to facilitate assembly of the array with similar arrays in end to end abutting relationship to construct a longer array, comprising: a base, at least one row of image processing elements on the base extending linearly from end to end; and at least one array aligning formation at a preset location on the array base, the array aligning formation being adapted to mate with one of second complementary array aligning formations fixed in predetermined array aligning positions to locate the array in predetermined end to end relation with similar arrays to construct the longer array.

IN THE DRAWINGS

Figure 1:
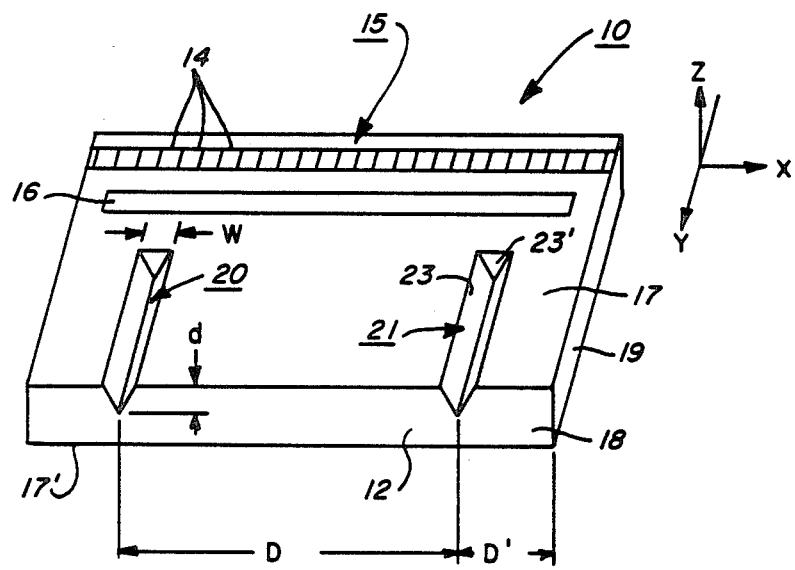
FIG. 1 is an isometric view of the scanning array of the present invention designed to facilitate assembly in end to end abutting relation with similar arrays to permit assembly of a full width scanning array.

Referring particularly to FIG. 1 of the drawings, there is shown a sensor array or chip, designated generally by the numeral 10, for use in the array fabricating system of the present invention. As will appear, the present invention enables a plurality of relatively short scanning arrays 10 to be assembled on a base member 52 (seen in FIG. 5) in aligned end to end relation to form a relatively long composite scanning array or chip 50 (seen in FIG. 5). Preferably, the length of the composite array is made equal to the maximum size (in the scan or X direction) of the image to be processed. As will be understood, the composite scanning array may be formed from either a series of image read arrays (i.e. Charge Coupled Devices, photodiode arrays, etc.) to provide a composite read array for scanning document originals and converting the document image to electrical signals or pixels, or a series of image write arrays (i.e. Light Emitting Diodes, magnetic heads or other printing heads, etc) to provide a composite write array for writing images on a suitable imaging member such as the photoconductor of a xerographic reproduction or copying system in accordance with an image signal or pixel input.

Figure 5:
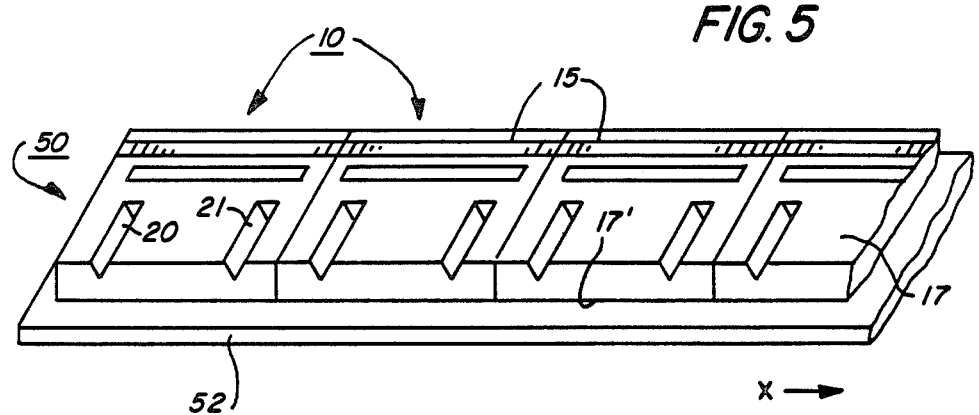
FIG. 5 is an isometric view showing a full width scanning array constructed in accordance with the principles of the present invention.

Scanning array 10 includes a generally rectangular base 12, which is normally (100) silicon, with a plurality of sensors 14 arranged in a linear row or array 15 in one surface 17 thereof. Sensor row 15 is parallel to side edge 18 of the array base 12. Cooperating control circuitry 16, which may include logic gates and a shift register (not shown) is also integrated onto the array base 12 for controlling operation of the sensors 14. Sensors 14 may, for example, comprise photodiodes adapted to convert image rays impinging thereupon to electrical signals or pixels in the case of a read array, or LEDs selectively operated in response to an image signal input to produce image rays corresponding to the image represented by the image signals for exposing an imaging member (not shown). To permit array 10 to be joined in abutting relation with other like arrays (as seen in FIG. 5), the row 15 of sensors 14 extend to the ends 19 of the array base 12.

To enable scanning array 10 to be accurately and exactly aligned in end to end abutment with other like arrays as will appear more fully herein, predetermined array aligning formations preferably comprising longitudinally extending V-shaped grooves or depressions 20, 21 are provided in the surface 17 of base 12. In the embodiment shown in FIG. 1, array aligning grooves 20, 21 extend in the Y-direction and are substantially perpendicular to the side edge 18 of array base 12, grooves 20, 21 extending from the interior of the surface 17 to edge 18 thereof. The internal dimension w' of grooves 20, 21 at height h is equal to the diameter of pins 30 of alignment tool 25 (seen in FIG. 6). Array aligning grooves 20, 21 are separated from one another by a predetermined distance D, each groove having a predetermined depth d with a predetermined maximum width W. Grooves 20, 21 are spaced from the sides of base 12 by a distance D'.

Figure 2:
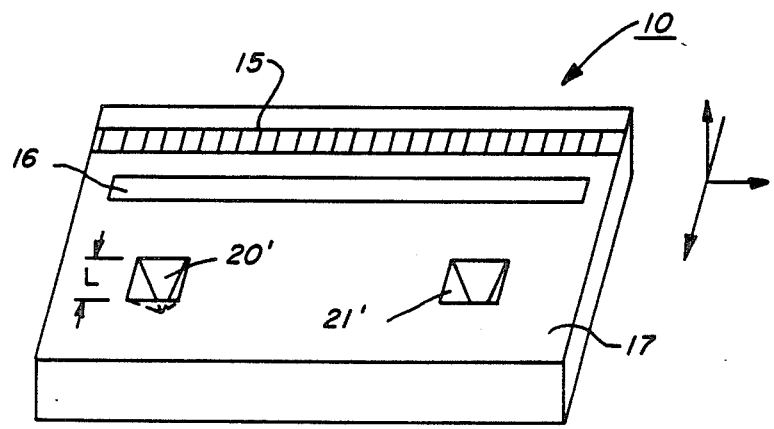
FIG. 2 is an isometric view of an alternate scanning array design.

In the embodiment shown in FIG. 2, the length L of the array aligning grooves in the Y-direction, which are designated here by the numbers 20', 21', is substantially equal to W while the internal dimension w' of grooves 20', 21' at height h is equal to the diameter of the aligning pins 30 of the alignment tool 25 (seen in FIG. 6), the grooves 20', 21' being entirely within the confines of the surface 17. Aligning grooves having a length L less than the length of grooves 20, 21 but greater than the length of grooves 20', 21', may be envisioned.

The array aligning grooves 20, 21 and 20', 21' are preferably etched in the surface 17 of the array base 12 by conventional VMOS silicon integrated circuit fabrication techniques. Other ways of forming the array aligning grooves such as by mechanical or laser machining techniques may be contemplated.

Figure 3:
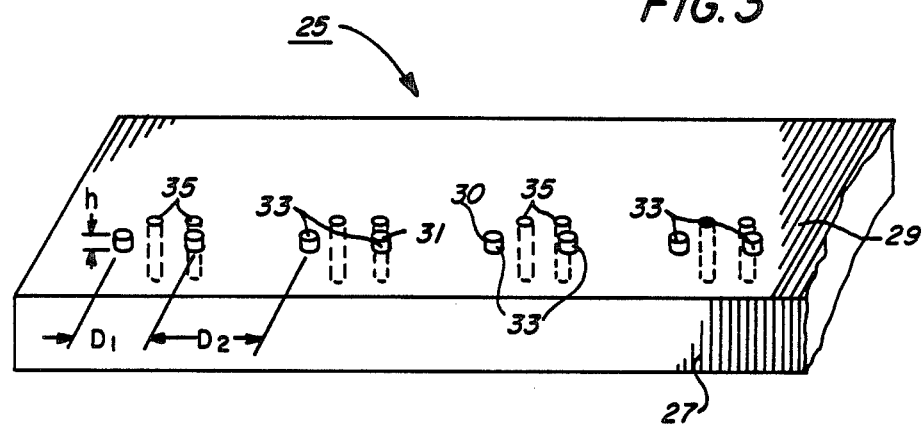
FIG. 3 is an isometric view of the aligning tool of the present invention for assemblying the scanning arrays of FIGS. 1 and 2 in accurate predetermined abutting relation to form a full width scanning array.

Referring now to FIG. 3 of the drawings, an alignment tool, designated generally by the numeral 25, for aligning the relatively short arrays 10 in end to end relation with one another is thereshown. Alignment tool 25 has a generally rectangular base 27, at least one surface 29 of which is made optically flat. A plurality of array aligning formations which preferably comprise outwardly projecting bumps or pins 20, are provided on the surface 29 of tool base 27. Array aligning pins 30 project above the surface 29 by a distance h, the distance h being chosen to assure entry of pins 30 into the grooves 20, 21 or 20', 21' of scanning arrays 10 with the outer end 31 of the array aligning pins 30 in contact with the side walls 23 of the array aligning grooves upon assembly of arrays 10 with alignment tool 25. Array aligning pins 30 are located on tool base 27 at predetermined locations, there being one pair 33 of aligning pins 30 provided for each array 10 in the composite array. The center-to-center distance D-1 between the aligning pins of each pair 33 matches the distance D between the array aligning grooves, with each pin pair 33 being separated from the next pin pair by a distance D-2 equal to twice the distance D' between each aligning groove and the side 19 of array base 12. As described earlier, in the FIG. 2 embodiment, the diameter d' of aligning pins 30 is substantially equal to the dimension w' of the array aligning grooves 20', 21' in the Y-direction.

A series of strategically located vacuum ports 35 are provided in tool base 27, ports 35 passing through tool base 27 and communicating with a suitable vacuum plenum (not shown). As will be understood, vacuum applied to ports 35 aids in drawing the smaller arrays 10 placed thereon into tight engagement with the surface 29 of tool 25.

Figure 4:
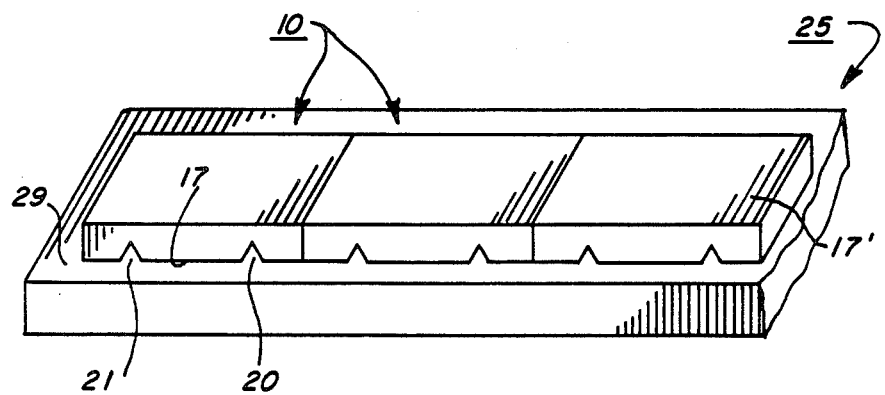
FIG. 4 is an isometric view illustrating the assembly procedure of the present invention wherein arrays of the type shown in FIGS. 1 and 2 are abutted in end to end relation by the aligning tool of FIG. 3 to form a full width scanning array.
Figure 6:
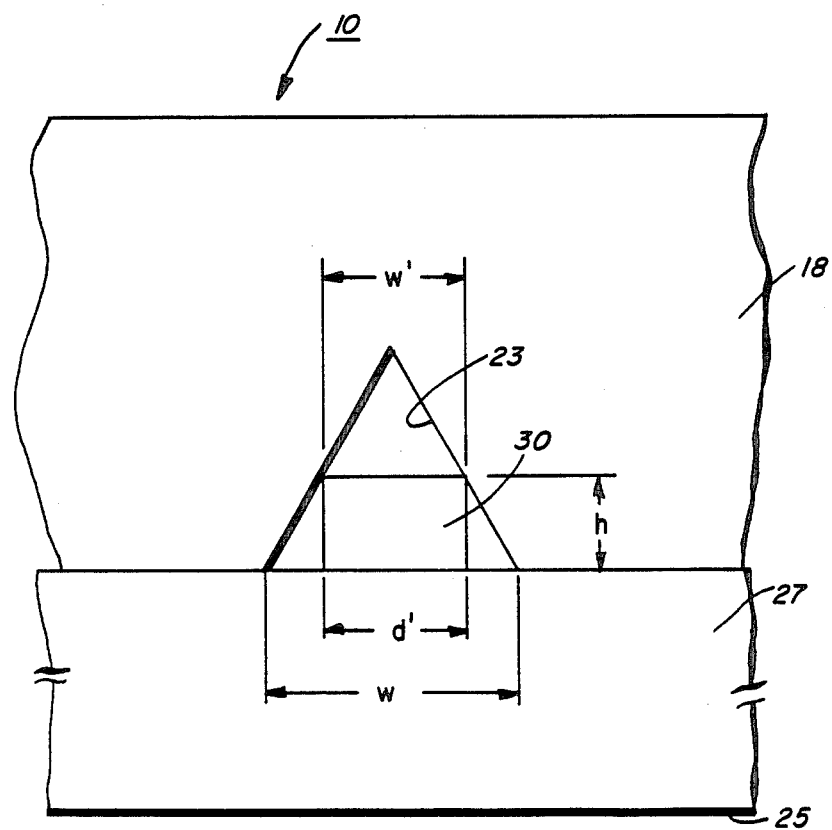
FIG. 6 is an enlarged view showing the operative relationship between the mating array aligning pin and groove of the alignment tool of FIG. 3 and the array of FIGS. 1 and 2.

Referring particularly to FIGS. 4, 5, and 6 of the drawings, to assemble a longer composite scanning array 50 from a plurality of small scanning arrays 10, the small arrays 10 are placed in a row on aligning tool 25 with the surface 17 of the arrays 10 against the surface 29 of tool 25 and with the pairs 33 of array aligning pins 30 of tool 25 projecting into the array aligning grooves 20, 21 (or 20', 21') of each individual array 10. Vacuum admitted to ports 35 of tool 25 draws the arrays 10 tightly against the tool 25, forcing the projecting array aligning pins 30 into the array aligning grooves (as shown in FIG. 6) and physically locating the individual arrays 10 in proper end to end abutting relationship with one another. As will be understood, the sloping sides 23 of the grooves 20, 21 (or 20', 21') cooperate with the terminal end of the pins 30 to center the grooves on pins 30 thereby accurately locating each of the arrays 10 in the X-direction on tool 25.

In the array embodiment of FIG. 1, by virtue of the extension of grooves 20, 21 to the edge of the array base 12, the individual arrays, during assembly with the aligning tool 25, are slid forward onto the aligning pin pairs 33, each array being moved forward on the aligning pins 30 until the inside wall 23' of the grooves 20, 21 is contacted. As will be understood, this procedure locates each individual array 10 in both the Y and Z directions with face to face contact between surface 17, 29 of the individual arrays 10 and the tool 25 locating the arrays in the X direction.

In the FIG. 2 embodiment, the individual arrays 10 are lowered rather than slid into position on aligning tool 25. Since the diameter of pins 30 matches the longitudinal extent of grooves 20', 21', assembly of each array 10 with the tool 25 exactly locates, through interengagement of the locating pins 30 with the respective grooves 20', 21', the arrays 10 in the X and Y directions.

Following placing and locating of the total number of small arrays 10 that comprise the longer composite scanning array 50 on aligning tool 25, a base member 52, which may for example be formed from copper clad invar, is placed against the bottom face 17' of the arrays assembled on tool 25, the dimension of base member 52 preferably being slightly larger than that of the array assembly. Following placing of base member 52 on the arrays, base member 52 is securely attached to the arrays as by epoxy bonding. Aligning tool 25 is thereafter removed, leaving the unitary composite full width array 50 shown in FIG. 5.

Other shapes, combinations, and locations for the array aligning formations instead of the cooperating grooves and pins shown and described herein may instead be envisioned including a single cooperating aligning formation for both scanning arrays 10 and aligning tool 25. As will be understood by those skilled in the art, where base 12 of scanning arrays 10 comprise (110) silicon, the array aligning grooves formed by etching will be U-shaped in cross section rather than V-shaped. And, while aligning receptacles are illustrated on arrays 10 with cooperating aligning projections on tool 25, the aligning formation types may be reversed with aligning projections formed on the individual scanning arrays 10 and the aligning receptacles formed on tool 25.

While the invention has been described with reference to the structure disclosed, it is not confined to the details set forth, but is intended to cover such modifications or changes as may come within the scope of the following claims.

We claim:

1. A short linear scanning array adapted to be assembled with like ones of said short arrays in end to end abutting relationship to provide a longer linear scanning array, said short array including a base and at least one row of image processing elements, the improvement comprising:

at least two array aligning formations on said short array base, said array aligning formations being disposed at preset locations on said short array base, said array aligning formations being adapted to associate with stationary array aligning formations disposed in predetermined array aligning locations to permit assembly of said short array with others of said short arrays to provide said longer array.

2. The short array according to claim 1 in which said array aligning formations comprise V-shaped depressions in said short array.

3. The short array according to claim 1 in which said depressions extend at least to one edge of said base.

* * * * *